United States Patent [19]

Suzuki et al.

[11] Patent Number: 5,660,552
[45] Date of Patent: Aug. 26, 1997

[54] SOCKET CONNECTOR WITH A PUSH-BUTTON FOR A BELL CRANK

[75] Inventors: Keiichiro Suzuki; Tadashi Ishiwa, both of Tokyo, Japan

[73] Assignee: Japan Aviation Electronics Industry, Limited, Tokyo, Japan

[21] Appl. No.: 391,590

[22] Filed: Feb. 21, 1995

[30] Foreign Application Priority Data

Apr. 18, 1994 [JP] Japan .................. 6-078900

[51] Int. Cl.⁶ .................................................. H01R 13/62
[52] U.S. Cl. ............................................ 439/159; 439/157
[58] Field of Search .............................. 439/152–160, 439/372

[56] References Cited

U.S. PATENT DOCUMENTS

| | | |
|---|---|---|
| 4,810,200 | 3/1989 | Sakamoto .................. 439/155 |
| 4,898,540 | 2/1990 | Saito ........................ 439/160 |
| 5,026,296 | 6/1991 | Hashiguchi . |
| 5,051,101 | 9/1991 | Komatsu .................. 439/159 |
| 5,139,435 | 8/1992 | Komatsu et al. . |
| 5,149,276 | 9/1992 | Dixon . |
| 5,302,133 | 4/1994 | Tondreault . |
| 5,429,523 | 7/1995 | Tondreault .................. 439/160 |

FOREIGN PATENT DOCUMENTS 0 516 177 A1 12/1992 European Pat. Off. .
0 580 983 A1 2/1994 European Pat. Off. .

Primary Examiner—David L. Pirlot
Attorney, Agent, or Firm—Laff, Whitesel, Conte & Saret, Ltd.

[57] ABSTRACT

For removably receiving in a predetermined direction a printed circuit board (11) having first and second side edges, a socket connector comprises an insulator housing having first and second longitudinal ends, a bell crank (33) consisting of first and second crank arms (33(1), 33(2)) pivoted by an axle (29) to the insulator housing at the first longitudinal end, and a push-button (31) for pushing the first crank arm. When the push-button is pressed substantially downwardly in the predetermined direction, the first crank arm rotates outwardly relative to the predetermined direction around the axle. The second crank arm rotates to lift up the first side edge of the printed circuit board. It is preferred that the insulator housing comprises a longitudinal rod (17) preferably having a groove (21) and first and second side members (19(1), 19(2)) extended from the first and the second longitudinal ends to define extensions of the groove for removably receiving the printed circuit board.

2 Claims, 5 Drawing Sheets

SOCKET CONNECTOR WITH A PUSH-BUTTON FOR A BELL CRANK

BACKGROUND OF THE INVENTION

This invention relates to a socket connector for mounting a printed circuit board, such as a memory module, on a main board of an electronic apparatus.

In the manner which will later be described more in detail, such a socket connector is disclosed in U.S. patent application Ser. No. 08/179,163 filed Jan. 10, 1994, by Keiichiro Suzuki, one of the present joint inventors and assignor to Japan Aviation Electronics Industries, Limited, of Tokyo, Japan. This Suzuki patent application will be incorporated herein by reference. A prior-art socket connector described in the Suzuki patent application comprises a longitudinal rod extending between first and second longitudinal ends and first and second side members perpendicularly to the longitudinal rod at the first and the second longitudinal ends with a groove formed along the longitudinal rod and the first and the second side members for disconnectably receiving the printed circuit board. It should, however, be noted that a special tool is needed on disconnection of the printed circuit board.

A conventional socket connector of the Suzuki patent application comprises an insulator rod with an L-shaped lever in place of one of the first and the second side members. It may be possible to assemble the printed circuit board into the socket connector without the special tool with the lever left as it is. It should, however, be noted that the lever of the socket connector is placed at the longitudinal end so that appreciable space is necessary for manually turning the lever on disconnection of the printed circuit board from the socket connector. As a result, it is incapable of increasing a mounting density of such conventional socket connectors and printed circuit boards on the main board. This also renders the socket connector bulky and brings about an operational difficulty in handling.

SUMMARY OF THE INVENTION

It is consequently an object of the present invention to provide a compact socket connector capable of reducing a mounting density of a printed circuit board.

It is another object of the present invention to provide a socket connector which is of the type described and which is easily handled.

It is still another object of the present invention to provide a socket connector which is of the type described and which is capable of easily disconnecting a printed circuit board from a mounted or received state.

Other objects of the present invention will become clear as the description proceeds.

According to the present invention, there is provided a socket connector for connection of a printed circuit board having first and second side edges with the printed circuit board inserted in a predetermined direction, the socket connector comprising an insulator housing having first and second longitudinal ends and used to removably receive the first and the second side edges of the printed circuit board. The socket connector further comprises a bell crank consisting of first and second crank arms pivoted by an axle to the insulator housing at the first longitudinal end and a push-button for pushing the first arm, when pressed, to make the second crank arm lift up the first side edge of the printed circuit board for removal of the printed circuit board.

DESCRIPTION OF THE PREFERRED EMBODIMENTS

Figure 1:
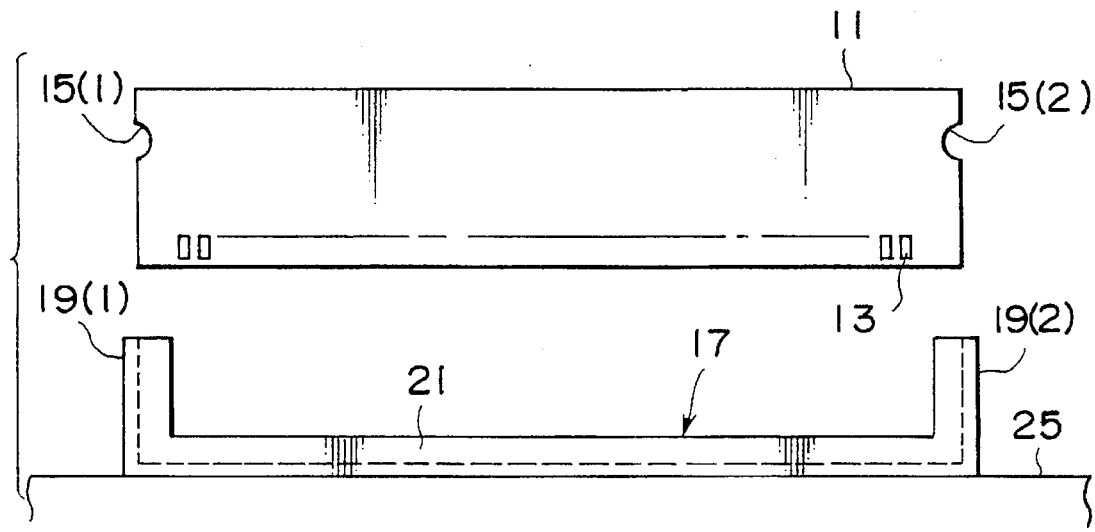
FIG. 1 is an exploded front view of a prior-art socket connector and a printed circuit board.

Referring now to FIG. 1, a prior-art socket connector will be described in order to facilitate an understanding of this invention. As described in the Suzuki patent application mentioned heretobefore, such socket connectors are applicable to removable reception of a printed circuit board 11 which is substantially rectangular in shape and has top and bottom edges and left and right or first and second side edges. The printed circuit board 11 has a row of conductive connecting pads 13 upwardly extended from the bottom edge. The first and the second side edges has left and right or first and second side recesses 15(1) and 15(2). Such first and second side recesses will either collectively or singly be designated by a simpler reference numeral 15 with omission of the suffixes enclosed with parentheses.

The prior-art connector comprises a longitudinal rod 17 extending between left and right or first and second longitudinal ends and left and right or first and second side members 19(1) and 19(2) or 19 perpendicularly to the longitudinal rod 15 at the first and the second longitudinal ends. A groove 21 is formed along the longitudinal rod 15 and the first and the second side members 19(1) and 19(2) for disconnectably receiving the printed circuit board 11. In one-to-one correspondence to the connecting pads 13, a plurality of conductive contacts 23 (later illustrated) are planted in the groove 21 to establish electric connection to the connecting pads 13, respectively, and are extended through the longitudinal rod 17 for electric connections to a main board 25 of an electronic apparatus (not shown) for such socket connector. It should, however, be noted in FIG. 1 that a special tool (not shown) is needed on disconnection of the printed circuit board 11 from the socket connector.

Figure 2:
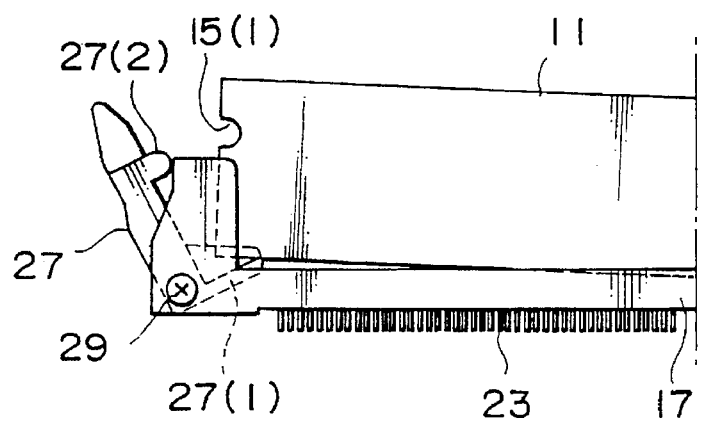
FIG. 2 is a partial front view of a conventional socket connector and a printed circuit in a partially removed state.

Turning to FIG. 2, a conventional socket connector of the Suzuki patent application comprises the longitudinal rod 17 with an L-shaped lever 27 swingably pivoted by an axle 29 to the first longitudinal end in place of the first side member 19(1). The L-shaped lever 27 is used either outwardly to rotate around the axle 29 from an upright position or inwardly return to the upright position. The L-shaped lever 27 has a wrench arm 27(1) for prying the bottom edge of the printed circuit board 11 and a side projection 27(2) for tight fit with the first side recess 15(1) of the printed circuit board 11. In FIG. 2, the conductive contacts 23 are protruded downwardly from a bottom of the longitudinal rod 17.

It is possible to assemble the printed circuit board 11 into the socket connector without the above-described special tool with the L-shaped lever 27 left as it is. It should, however, be noted in FIG. 2 that the L-shaped lever 27 of the socket connector is placed at the first longitudinal end so that an appreciable space is necessary for manually turning the levers 27 outwardly on disconnection of the printed circuit board 11 from the socket connector. This renders the socket connector bulky and brings about an operational difficulty by manually pushing the L-shaped lever 27 outwardly. In addition, it is incapable of increasing a mounting density of such connected socket connectors and the printed circuit board 11 on the main board 25.

Figure 3:
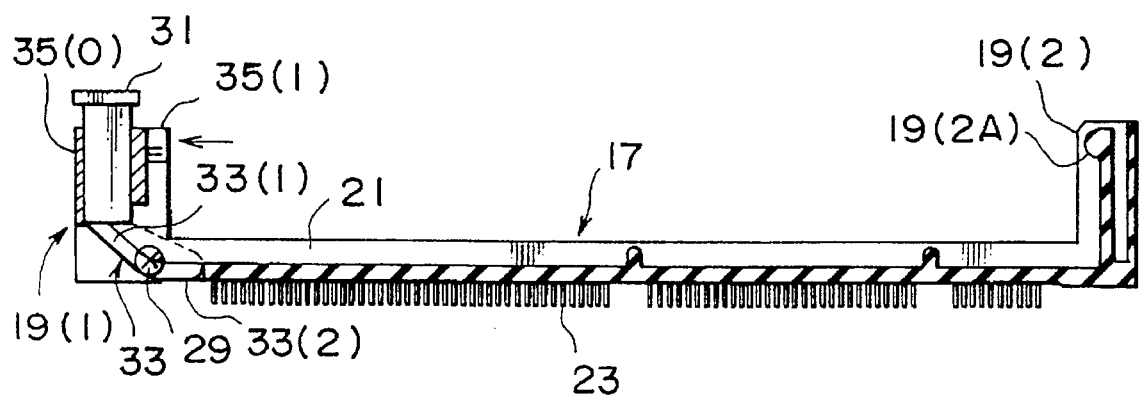
FIG. 3 is a partially sectional front view showing a socket connector according to a first embodiment of the instant invention.
Figure 4:
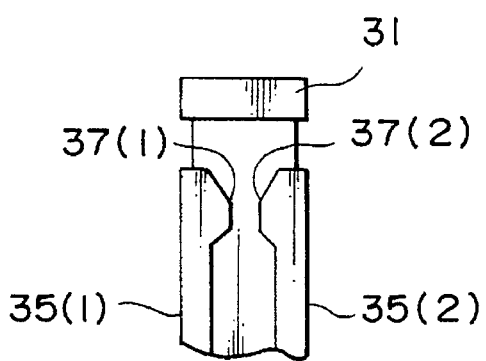
FIG. 4 is an enlarged partial left side view of the socket connector illustrated in FIG. 3.

Referring now to FIGS. 3 and 4, the description will proceed to a socket connector according to a first preferred embodiment of this invention. Throughout the following, similar parts are designated by like reference numerals.

The longitudinal rod 17 of this socket connector is formed with an ejection mechanism extended to a predetermined direction perpendicular to the longitudinal rod 17 from the first longitudinal end. In the manner which will later be described in greater detail, the ejection mechanism comprises a push-button 31 for a bell crank 33 and serves to primarily disconnect the printed circuit board 11 from a mounted or received condition when the push-button 31 is manually or otherwise pressed.

The push-button 31 is formed substantially perpendicularly to the longitudinal rod 17 above the bell crank 33. The bell crank 33 has first and second crank arms 33(1) and 33(2) pivoted by the axle 29 to the longitudinal rod 17 between a rest and a moved or rotated position. At the rest position, the first crank arm 33(1) is extended outwardly relative to the predetermined direction with the second crank arm 33(2) laid in the groove 21. In the example being illustrated, the first crank arm 33(1) has a top end surface in parallel with the longitudinal rod 17 to abut a bottom surface of the push-button 31 when put in the rest position.

When pressed substantially in the predetermined direction, the push-button 31 moves down the top end of the first crank arm 35(1) to rotate the crank arm 33 counter-clockwise around the axle 29. The second crank arm 33(2) pries the bottom edge of the printed circuit board 11 near the first longitudinal end. At this time, the printed circuit board 11 is partially lifted up to be removed from the mounted condition.

Referring more particularly to FIG. 3, the first side member 19(1) companies a sheath 35(0) and primary front and back side walls 35(1) and 35(2) longitudinally inwardly extended from the sheath 35(0). It is possible to manufacture the sheath 35(0) and the front and the back side walls 35(1) and 35(2) integrally of an insulating material. The front and the back side walls 35(1) and 35(2) are extended in the predetermined direction from the first longitudinal end to define an extension of the groove 21 for removably receiving the first side edge of the printed circuit board 11. Preferably, the front and the back side walls 35(1) and 35(2) are for pinching engagement with the first recess 15(1) of the printed circuit board 11 when the printed circuit board 11 is perfectly inserted in the socket connector.

In FIG. 4, the front and the back side walls 35(1) and 35(2) have a pair of opposite wall surfaces, from which surfaces dowel stoppers 37(1) and 37(2) are protruded respectively for the pinching engagement in a board thickness direction of the printed circuit board 11. The dowel stoppers 37(1) and 37(2) are engaged with the printed circuit board 11 with a click in the first recess 15(1) when the printed circuit board 11 is wholly inserted in the socket connector.

In FIG. 3, the second side member 19(2) comprises secondary front and back side walls like the first side member 19(1). These front and back side walls define another extension of the groove 21 for removably receiving the second side edge of the printed circuit board 11. The second side member 19(2) further comprises an inwardly directed projection 19(2A) between the secondary front and back side walls. When the printed circuit board 11 is put completely in the mounted position, the projection 19(2A) engages with the second recess 15(2).

The projection 19(2A) is resiliently attached to the longitudinal rod 17 near the second longitudinal end. On removing the printed circuit board 11 from the socket connector after the push-button 31 is pressed down, the projection 19(2A) is readily longitudinally outwardly displaced.

Figure 5:
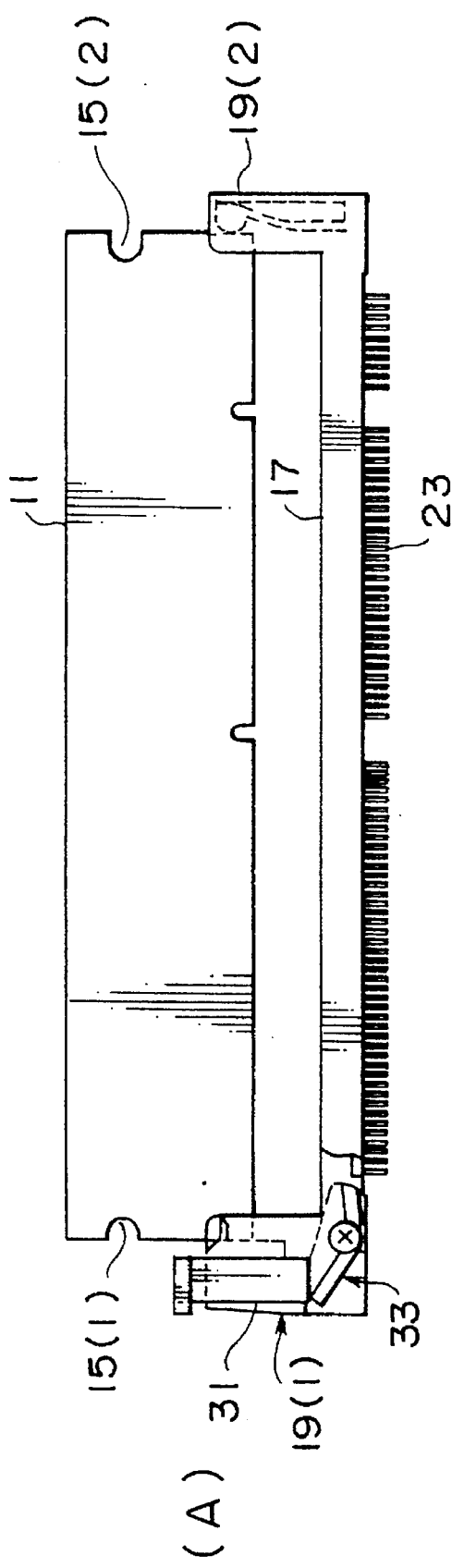
FIGS. 5(A) and (B) are front views of the socket connector depicted in FIG. 3 together with a printed circuit board for use in describing their connection cooperation.
Figure 5:
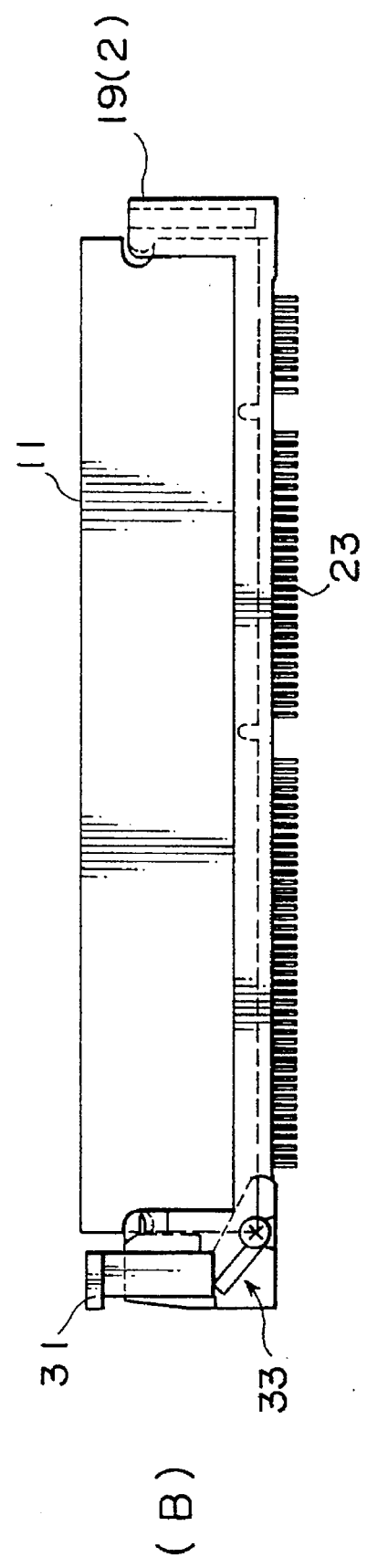

FIGS. 5(A) and (B) will be referred to, in addition to FIGS. 3 and 4. In FIG. 5(A), the printed circuit board 11 is first placed in parallel with the longitudinal rod 17 between the first and the second side members 19(1) and 19(2). In the meanwhile, the push-button 31 is not yet pushed down so that the bell crank 33 is put at the rest position. At this time, the bottom edge of the printed circuit board 11 may be partially pinched above the first longitudinal end by the dowel stoppers 37(1) and 37(2), the second side edge of the printed circuit board 11 abutting and pushing the projection 19(2A) above the second longitudinal end.

In FIG. 5(B), the printed circuit board 11 is manually or otherwise inserted and brought into mechanical contact with the socket connector. The first side edge of the printed circuit board 11 is wholly pinched by the dowel stoppers 37(1) and 37(2). The second side edge of the printed circuit board 11 abuts and pushes the projection 19(2A). As a result, the first and the second recesses 15(1) and 15(2) are engaged in the ejection mechanism and the second side member 19(2). Incidentally, the bell crank 33 still keep the rest position. It is possible to assemble the printed circuit board 11 in the socket connector without need of the bell crank 33.

Figure 6:
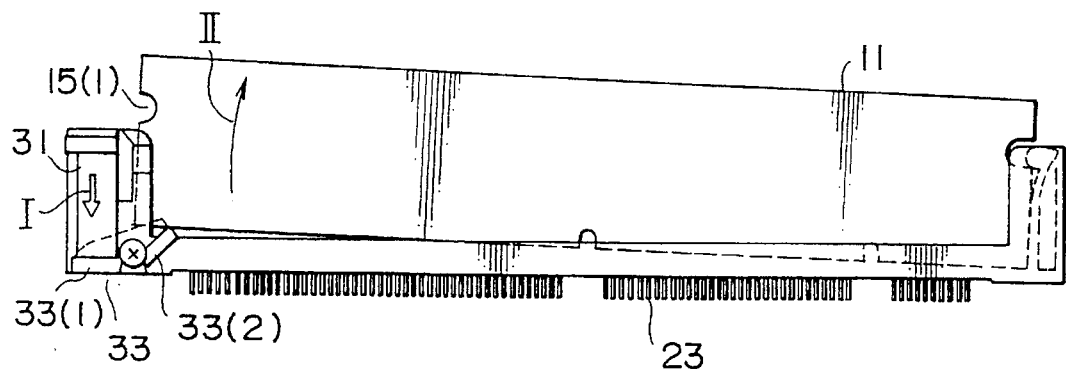
FIG. 6 is a front view of the socket connector depicted in FIG. 3 and the printed circuit board for use in describing their disconnection cooperation.

In FIG. 6, the printed circuit board 11 is brought out of mechanical contact with the socket connector with the push-button 31 pressed downwardly of the figure as indicated by a downwardly directed arrow I. The bell crank 33 rotates outwardly to lift up the printed circuit board 11. In other words, the printed circuit board 11 is pried by the second crank arm 33(2) clockwise as shown by a clockwise arrow II to be out of fit to the socket connector.

Figure 7:
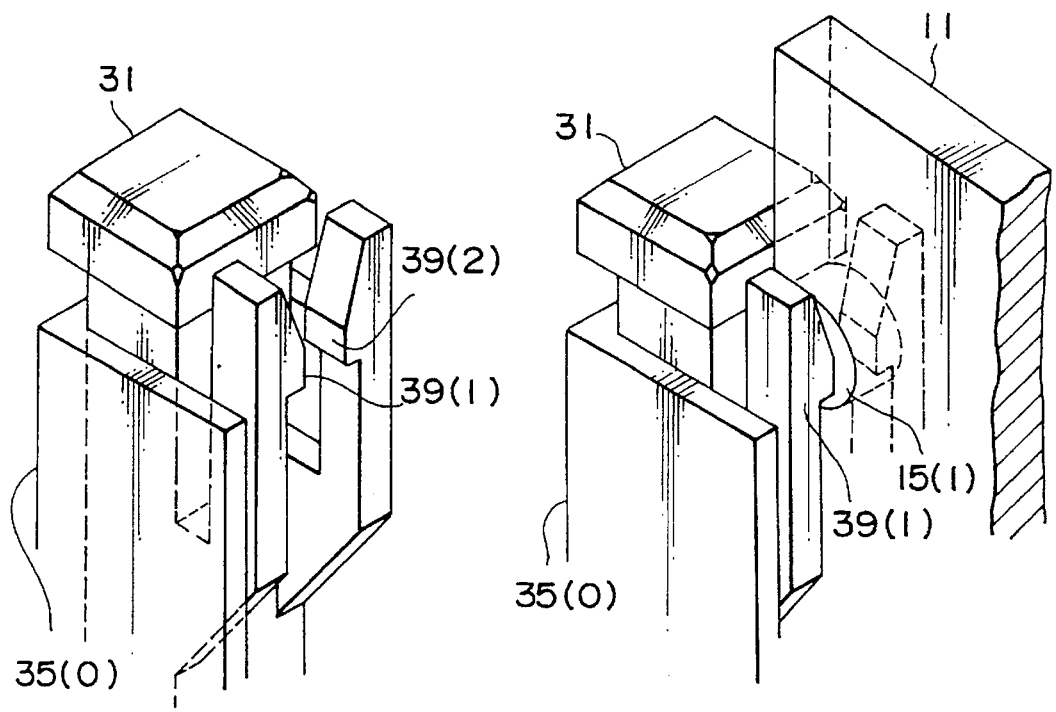
FIGS. 7(A) and (B) are enlarged partial perspective views of the socket connector according to a second embodiment of this invention and, in FIG. 7(B), together with the printed circuit board.

Referring afresh to FIGS. 7(A) and (B), the description will next proceed to a socket connector according to a second embodiment of this invention. As illustrated in FIG. 7(A), the push-button 31 is rectangular in cross-section to have a longitudinally inwardly directed surface and comprises front and back integral side jaws 39(1) and 39(2) extended in parallel to the predetermined direction from the inwardly directed surface. The sheath 35(0) is opened on a longitudinally inwardly directed side. Instead of the primary front and back side walls 35(1) and 35(2) described in conjunction with FIGS. 3 and 4, the jaws 39(1) and 39(2) define the extension of the groove 21. In FIG. 7(B), it should be noted that the front and back integral side jaws 39(1) and 39(2) serve to pinch engage with the first recess 15(1) when the printed circuit board 11 is inserted in the socket connector.

Figure 8:
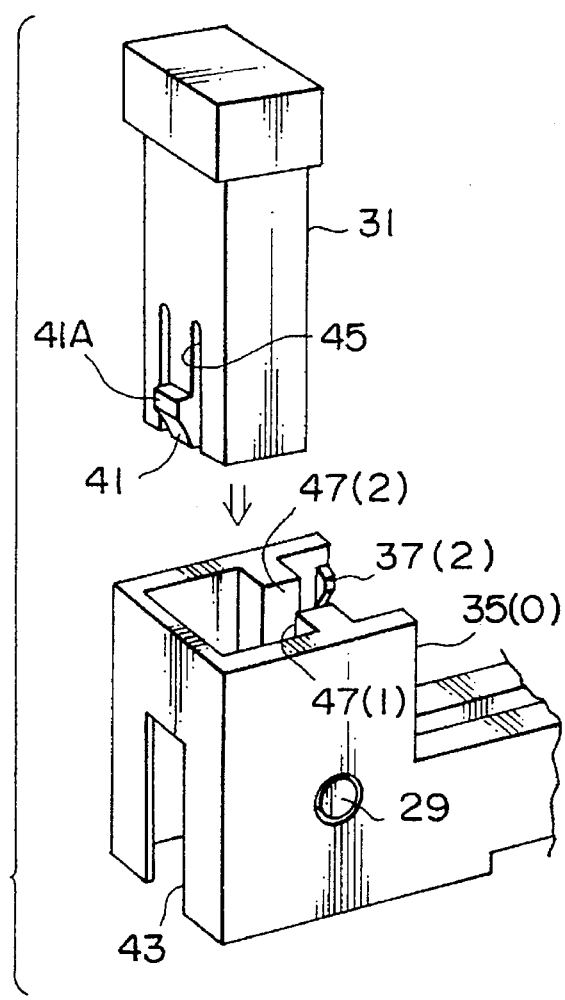
FIG. 8 is a partial perspective exploded view of a modification of the socket connector illustrated in FIG. 7(A)
Figure 9:
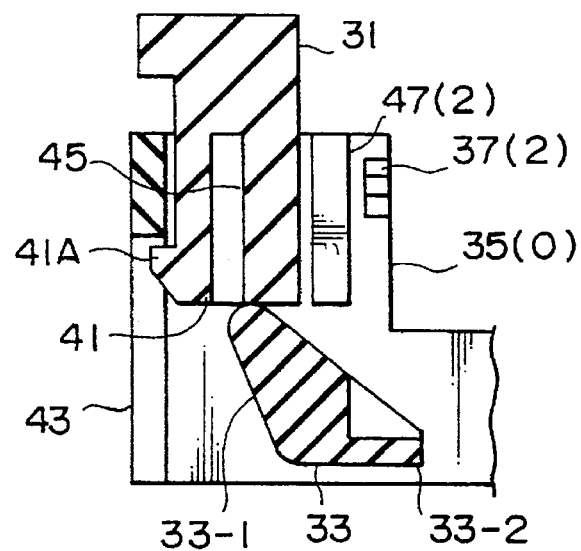
FIG. 9 is a partial vertical sectional view of the socket connector depicted in FIG. 8.

Referring now to FIGS. 8 and 9, the description will proceed to a modification of the socket connector illustrated with reference to FIGS. 3 to 6. The push-button 31 comprises a resilient stopper 41 with a resilient protrusion 41A protruded longitudinally outwardly for engaging with a rectangular notch 43 in the sheath 35(0). On mounting to the socket connector, the push-button 31 is forced into the sheath 35(0) so that the resilient protrusion 41A is received in the notch 43. After the push-button 31 is attached to the socket connector, the resilient protrusion 41A prevents the push-button 31 from coming out of the sheath 35(0). Near a bottom end of the push-button 31, a longitudinal hole 45 is formed in order to facilitate deformation of the resilient stopper 41.

More specifically, the sheath 35(0) comprises front and back opposite side walls 47(1) and 47(2) defining a groove for reception of the first side edge of the printed circuit board 11 and front and back resilient dowel stoppers 37(1) and 37(2) for pinching engagement with the printed circuit board 11 near the first side edges thereof.

Reviewing FIGS. 3 through 9, it has been confirmed that the push-button 31 may be pressed and released slidably obliquely of the predetermined direction.

In FIG. 3, the ejection mechanism is formed only on the first longitudinal end of the longitudinal rod 17. It is, however, possible to form another ejection mechanism symmetrically on the second longitudinal end. In this case, it is possible to remove the printed circuit board 11 from the socket connector with the printed circuit board 11 kept parallel to the longitudinal rod 17.

Furthermore, it is possible for the socket connector not only to improve its handling capability for disconnection but also to increase a mounting density on the main board 25. This is because these is no need of a space for making sure of rotation of the first crank arm 33(1).

While this invention has thus far been described in specific conjunction with two preferred embodiments thereof and a modification, it will be readily possible for one skilled in the art to put this invention into effect in various other manners. For example, the socket connector may comprise more conductive contact terminals 23 in number than the connecting pads 13 of the printed circuit board 11. This will make it possible to use each of socket connectors mounted on the main board 25 for various printed circuit boards, such as 11.

What is claimed is:

1. A socket connector having a plurality of contacts implanted within a socket, said socket connector being adapted for making a connection with a printed circuit board having first and second side edges and a plurality of connecting pads positioned in correspondence with said contacts, said printed circuit board being inserted in a predetermined direction into said socket to form a mechanically connected state with said contacts abutting against said connecting pads in said socket, said socket connector comprising:

an insulator housing having first and second longitudinal ends to removably receive the first and the second side edges of said printed circuit board;

a bell crank having first and second crank arms pivoted around an axle in said insulator housing at said first longitudinal end;

a push-button for pushing said first crank arm, when pressed, said first crank arm making said second crank arm lift the first side edge of said printed circuit board for removal of said printed circuit board, said printed circuit board being turned responsive to said lifting of said edge, said turning being with respect to a fulcrum at the second longitudinal end in order to mechanically disconnect said contacts to a position not abutting said connecting pads, and said printed circuit board being out of said socket responsive to said lifting of said printed circuit board;

said insulator housing comprising a longitudinal rod having first and second side members extending therefrom in said predetermined direction, said first and said second side members being located at said first and said second longitudinal ends, wherein said second side member comprises front and back side walls defining a groove for removably receiving said second side edge of said printed circuit board;

said printed circuit board having a recess in said second side edge, wherein said second side member comprises an inwardly directed resilient projection protruding in said predetermined direction and being located between said front and said back side walls for engagement with said recess of said printed circuit board when said socket connector receives said printed circuit board, and wherein said resilient protection is deformed to release said second side edge of said printed circuit board from said socket connector when said push-button is pressed to remove said printed circuit board from said socket, so that said second side edge of said printed circuit board is engaged with said resilient projection and is outwardly yielded from an original position of said second longitudinal end together with the fulcrum likewise displaced, in order to offset a respective positioning between said contacts and said connecting pads without producing an excessively abutting stress upon one another during said turning of said printed circuit board.

2. A socket connector for connecting a printed circuit board having first and second side edges, said printed circuit board being inserted in a predetermined direction into said socket, said socket connector comprising:

an insulator housing having first and second longitudinal ends to removably receive the first and the second side edges of said printed circuit board;

a bell crank having first and second crank arms pivoted around an axle in said insulator housing at said first longitudinal end;

a push-button for pushing said first crank arm, when pressed, said first crank arm making said second crank arm lift up the first side edge of said printed circuit board for removal of said printed circuit board;

said insulator housing comprising a longitudinal rod and first and second side members extending in said predetermined direction, said first and second side members being located at said first and said second longitudinal ends, wherein said second side member comprises front and back side walls defining a groove for removably receiving said second side edge of said printed circuit board;

wherein said push-button comprises front and back integral side jaws extended in parallel to said predetermined direction and from a side surface of said push-button for making a pinching engagement with said first recess when said printed circuit board is inserted in said socket connector.

* * * * *

UNITED STATES PATENT AND TRADEMARK OFFICE
CERTIFICATE OF CORRECTION

PATENT NO.    : 5,660,552
DATED         : August 26, 1997
INVENTOR(S)   : Keiichiro Suzuki; Tadashi Ishiwa It is certified that error appears in the above-indentified patent and that said Letters Patent is hereby corrected as shown below:

Column 3, Line 43, delete "first crank arm 35(1)" and insert --first crank arm 33(1)--.

Signed and Sealed this

Ninth Day of December, 1997

Attest:

BRUCE LEHMAN

Attesting Officer

Commissioner of Patents and Trademarks